US010642163B2

(12) United States Patent
Li et al.

(10) Patent No.: US 10,642,163 B2
(45) Date of Patent: May 5, 2020

(54) SYSTEM AND METHOD FOR CONTROLLING EXPOSURE DOSE OF LIGHT SOURCE

(71) Applicant: SHANGHAI MICRO ELECTRONICS EQUIPMENT (GROUP) CO., LTD., Shanghai (CN)

(72) Inventors: Pingxin Li, Shanghai (CN); Meng Li, Shanghai (CN); Zhiyong Jiang, Shanghai (CN); Pengchuan Ma, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/465,058

(22) PCT Filed: Nov. 24, 2017

(86) PCT No.: PCT/CN2017/112805
§ 371 (c)(1),
(2) Date: May 29, 2019

(87) PCT Pub. No.: WO2018/099325
PCT Pub. Date: Jun. 7, 2018

(65) Prior Publication Data
US 2019/0302629 A1    Oct. 3, 2019

(30) Foreign Application Priority Data

Nov. 29, 2016  (CN) ........................ 2016 1 1073755

(51) Int. Cl.
*G03F 7/20* (2006.01)

(52) U.S. Cl.
CPC ............................. *G03F 7/70558* (2013.01)

(58) Field of Classification Search
CPC ............. G03F 7/70191; G03F 7/70583; G03F 7/70558
(Continued)

(56) References Cited

U.S. PATENT DOCUMENTS 6,411,368 B1 * 6/2002 Matsumoto ........... G03F 7/2006
355/67
6,813,004 B1   11/2004 Horikoshi et al.
(Continued)

FOREIGN PATENT DOCUMENTS

CN    101231475 A    7/2008
CN    101231475 A    7/2008
(Continued)

*Primary Examiner* — Hung Nguyen
(74) *Attorney, Agent, or Firm* — Muncy, Geissler, Olds & Lowe, P.C.

(57) ABSTRACT

A system and method for controlling an exposure dose of a light source are disclosed. The system includes an LED light source, a light homogenizer, an energy detection unit and an exposure dose control unit coupled to both the LED light source and the energy detection unit. The energy detection unit includes an energy detector corresponding to the LED light source or the light homogenizer and an energy spot sensor corresponding to a wafer. By using the LED light source capable of producing UV light in lieu of an existing mercury lamp, the system is less hazardous and safer by eliminating the risk of discharging hazardous mercury vapor into the environment when the mercury lamp is broken. Moreover, exposure illuminance of the LED light source can be adjusted and the LED light source can be turned on/off under the control of exposure dose control unit to expose the wafer with high dose control accuracy, without needing to use a variable attenuator or an exposure shutter. This reduces the system's complexity and cost and increases its reliability.

8 Claims, 2 Drawing Sheets

(58) Field of Classification Search
USPC .............................................. 355/53, 67–71
See application file for complete search history.

(56) References Cited

U.S. PATENT DOCUMENTS

| | | |
|---|---|---|
| 2001/0012100 A1 | 8/2001 | Kurosawa et al. |
| 2004/0007990 A1 | 1/2004 | Kitaoka |
| 2005/0041226 A1* | 2/2005 | Tanaka ................ G03F 7/70241 |
| | | 355/53 |
| 2005/0122498 A1 | 6/2005 | Jasper |
| 2007/0273853 A1* | 11/2007 | Bleeker ................ G03B 27/54 |
| | | 355/46 |
| 2009/0257038 A1 | 10/2009 | Yamamoto |
| 2014/0340665 A1* | 11/2014 | Shih .................... G03F 7/70191 |
| | | 355/71 |
| 2016/0327869 A1 | 11/2016 | Nagahara et al. |

FOREIGN PATENT DOCUMENTS

| | | |
|---|---|---|
| CN | 201194068 Y | 2/2009 |
| CN | 102253602 A | 11/2011 |
| CN | 202331000 U | 7/2012 |
| CN | 105319858 A | 2/2016 |
| EP | 1517189 A2 | 3/2005 |
| TW | 200424800 A | 11/2004 |
| TW | 200907604 A | 2/2009 |

* cited by examiner

SYSTEM AND METHOD FOR CONTROLLING EXPOSURE DOSE OF LIGHT SOURCE

TECHNICAL FIELD

The present invention relates to the field of photolithography and, in particular, to a system and method for controlling an exposure dose of a light source.

BACKGROUND

Photolithography is a technique employed in semiconductor device fabrication, in which an optical system is used to accurately project an image of a pattern on a reticle onto photoresist coated on the surface of a wafer and expose the photoresist. Accurately reproducing critical-size features in the reticle pattern on the wafer requires exposure dose control.

FIG. 1 shows an exposure system of a conventional step-and-repeat photolithography machine, in which a mercury lamp is used as a light source. The construction of the whole light path mainly includes the mercury lamp 100, an ellipsoidal reflector 101, a reflector 102, a coupling lens group 103, an exposure shutter 104, a variable attenuator 105, a light homogenizer 106, an energy detector 107, a relay lens group 108, a relay reflector 109, a projection objective 110 and an energy spot sensor 111. Reflected successively by the ellipsoidal reflector 101 and the reflector 102, the light from the mercury lamp 100 forms a light cone outside the lamp chamber. The light cone is then coupled by the coupling lens group 103 into the light homogenizer 106. The light homogenizer 106 is a quartz rod with certain specifications, where the light is reflected for multiple times. The light then exits the quartz rod uniformly at an end surface thereof, which is located in an object plane of the relay lens group 108. As a result, a uniform field of illumination with a certain degree of telecentricity and a certain numerical aperture (NA) is formed on an image plane of the relay lens group 108.

FIG. 2 shows a dose control system in the exposure system of the conventional step-and-repeat photolithography machine, which includes a mercury lamp controller 112, the exposure shutter 104, the variable attenuator 105, the energy detector 107, the energy spot sensor 111 and a dose control circuit board 200. However, the following deficiencies have been identified from the practical use of such a dose control system: 1) since the illuminance of the mercury lamp as a light source is not controllable, it has to additionally employ the variable attenuator for producing illuminance levels required in low-dose exposure applications, which, however, on the one hand, increases the complexity and cost of the system, and on the other hand, reduces the reliability of the system because the variable attenuator is a moving part; 2) as the mercury lamp places demanding operational requirements, such as long turn-on and warm-up times and disallowed frequent switching on/off, it has to additionally employ the exposure shutter, which however, on the one hand, increases the complexity and cost of the system, and on the other hand, significantly reduces the reliability of the system because the exposure shutter needs to frequently move; and 3) the mercury lamp is a potential hazard because it is filled with high-pressure mercury vapor, which, when leaked due to misuse, may seriously harm the environment and workers at the site.

SUMMARY OF THE INVENTION

The present invention aims to solve the problems of high complexity, high cost, low reliability and low safety problems with the conventional systems by presenting a novel system and method for controlling an exposure dose of a light source.

In pursuit of this aim, the subject matter of the present invention lies in a system for controlling an exposure dose of a light source, including an LED light source, a light homogenizer, an energy detection unit and an exposure dose control unit coupled to both the LED light source and the energy detection unit, the energy detection unit including an energy detector corresponding to the LED light source or the light homogenizer and an energy spot sensor corresponding to a wafer.

Additionally, the exposure dose control unit may include an LED light source controller and a dose control circuit board, which are coupled to each other, the LED light source controller coupled to the LED light source, the dose control circuit board coupled to both the energy detector and the energy spot sensor.

Additionally, the dose control circuit board may store thereon data about cumulative doses from shutdown to complete dark of the LED light source at various light intensities.

Additionally, the dose control circuit board may store thereon a relationship between a driving current of the LED light source and a resulted light intensity.

Additionally, the LED light source may be an LED array and have a wavelength of 465 nm, or 435 nm, or 365 nm.

Additionally, the light homogenizer may be implemented as a light-homogenizing quartz rod.

The present invention also provides a control method used with the system for controlling an exposure dose of a light source as defined above, including the steps of:

S1) simultaneously turning on an LED light source and an energy detector under a control of an exposure dose control unit so that the energy detector detects illuminance of the LED light source;

S2) sampling actual illuminance on a wafer and calculating a cumulative dose on the wafer by integrating the samples, by the exposure dose control unit;

S3) once the illuminance of the LED light source becomes stable, retrieving a cumulative dose from shutdown to complete dark of the LED light source based on a light intensity of the LED light source; and S4) upon the cumulative dose on the wafer calculated in step S2 becoming equal to a preset dose minus the cumulative dose from shutdown to complete dark of the LED light source retrieved in step S3, shutting down the LED light source under the control of the exposure dose control unit.

Optionally, the control method may further include:

S5) subsequent to the complete dark of the LED light source, turning off the energy detector under the control of the exposure dose control unit, and calculating a dose offset between the current cumulative dose on the wafer and the preset dose; and S6) adjusting the light intensity of the LED light source based on the dose offset under the control of the exposure dose control unit.

Additionally, step S1 may further include calibrating the energy spot sensor and calibrating the energy detector using the calibrated energy spot sensor.

Additionally, in step S2, the exposure dose control unit may sample an actual illuminance level expressed as:

$$I_{ESS} = \text{Gain} * I_{ED} + \text{Offset} = I_{wafer},$$

where, $I_{ED}$ represents an illuminance measurement of the energy detector; $I_{ESS}$ represents an illuminance measurement of the energy spot sensor; Gain and Offset respectively represent a scale factor and a dose offset; and $I_{wafer}$ represents actually measured illuminance on the wafer.

Additionally, in step S2, the cumulative dose $D_{get}$ on the wafer may be calculated according to:

$$D_{get}=\int_0^t I_{wafer} \cdot tdt = \int_0^t (Gain*I_{ED}+Offset) \cdot tdt$$

where, $I_{wafer}$ denotes actually measured illuminance on the wafer and t represents time.

Additionally, in step S5, the preset dose $D_{set}$ may be given as:

$$D_{set}=\int_0^{tclose}(Gain*I_{ES}+Offset) \cdot tdt+D_{close},$$

and the cumulative dose $D_{get}$ upon the complete dark of the LED light source as:

$$D_{get}=\int_0^t I_{wafer} \cdot tdt = \int_0^{tclose}(Gain*I_{ED}+Offset) \cdot tdt + \int_{tclose}^t (Gain*I_{ED}+Offset) \cdot tdt,$$

so the dose offset $D=|D_{set}-D_{get}|$, where, $t_{close}$ represents a timing when the LED light source is shut down; $D_{close}$ represents the cumulative dose retrieved in step S3; $I_{wafer}$ represents actually measured illuminance on the wafer; and |•| represents an absolute value operation.

Additionally, in step S3, the cumulative dose from the shutdown to the complete dark of the LED light source corresponding to a light intensity thereof after the illuminance of the LED light source becomes stable is retrieved from the dose control circuit board.

Additionally, in step S6, the dose control circuit board controls an LED light source controller based on the dose offset so that the LED light source controller controls the light intensity of the LED light source based on a relationship between a driving current of the LED light source and a resulted light intensity.

In summary, the present invention provides a system and method for controlling an exposure dose of a light source. The system includes an LED light source, a light homogenizer, an energy detection unit and an exposure dose control unit coupled to both the LED light source and the energy detection unit. The energy detection unit includes an energy detector for the LED light source or for the light homogenizer and an energy spot sensor for a wafer. By using the LED light source capable of producing ultraviolet (UV) light in lieu of an existing mercury lamp, the system is less hazardous and safer by eliminating the risk of discharging hazardous mercury vapor into the environment when the mercury lamp is broken. Moreover, exposure illuminance of the LED light source can be adjusted and the LED light source itself can be turned on/off under the control of exposure dose control unit to expose the wafer with high dose control accuracy, without needing to use a variable attenuator or an exposure shutter. This reduces the system's complexity and cost and increases its reliability.

BRIEF DESCRIPTION OF THE DRAWINGS

In FIGS. 1 to 2: 100—mercury lamp light source; 101—ellipsoidal reflector; 102—reflector; 103—coupling lens group; 104—exposure shutter; 105—variable attenuator; 106—light homogenizer; 107—energy detector; 108—relay lens group; 109—relay reflector; 110—projection objective; 111—energy spot detector; 112—mercury lamp controller; 200—dose control circuit board.

In FIGS. 3 to 4: 1—LED light source; 2—light homogenizer; 31—energy detector; 32—energy spot sensor; 4—exposure dose control unit; 41—LED light source controller; 42—dose control circuit board.

DETAILED DESCRIPTION

The present invention will be described in detail below with reference to the accompanying drawings.

Figure 1:
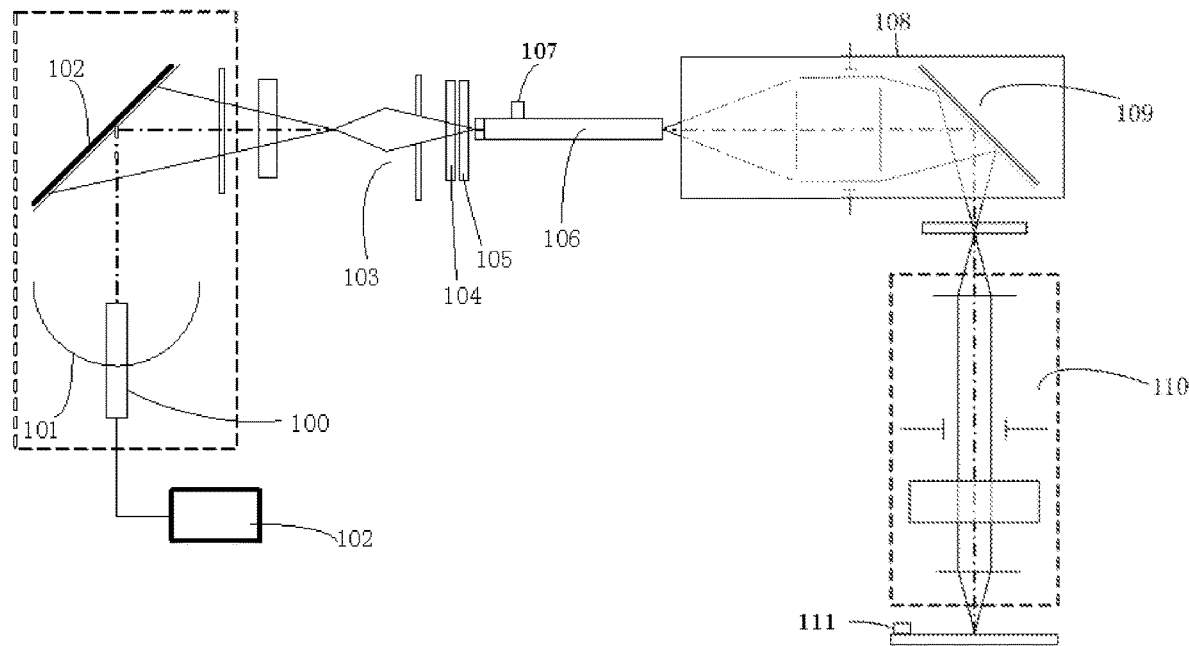
FIG. 1 is a structural schematic view of an exposure system in a conventional step-and-repeat photolithography machine.
Figure 2:
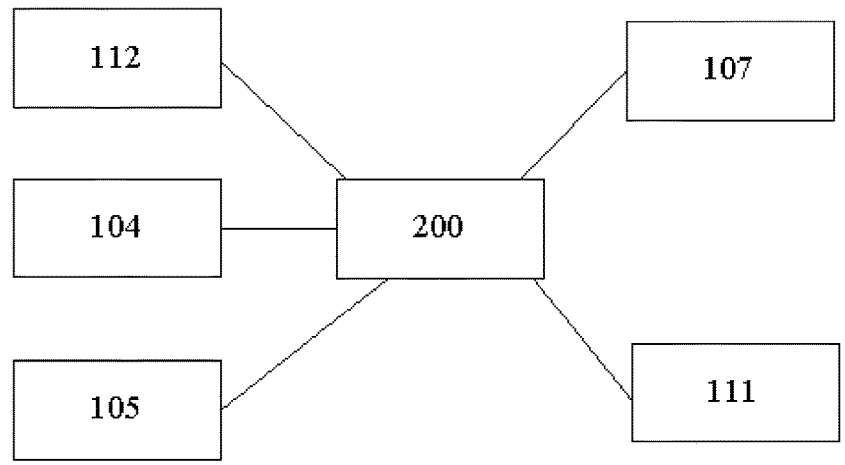
FIG. 2 shows a dose control system in the exposure system of the conventional step-and-repeat photolithography machine.
Figure 3:
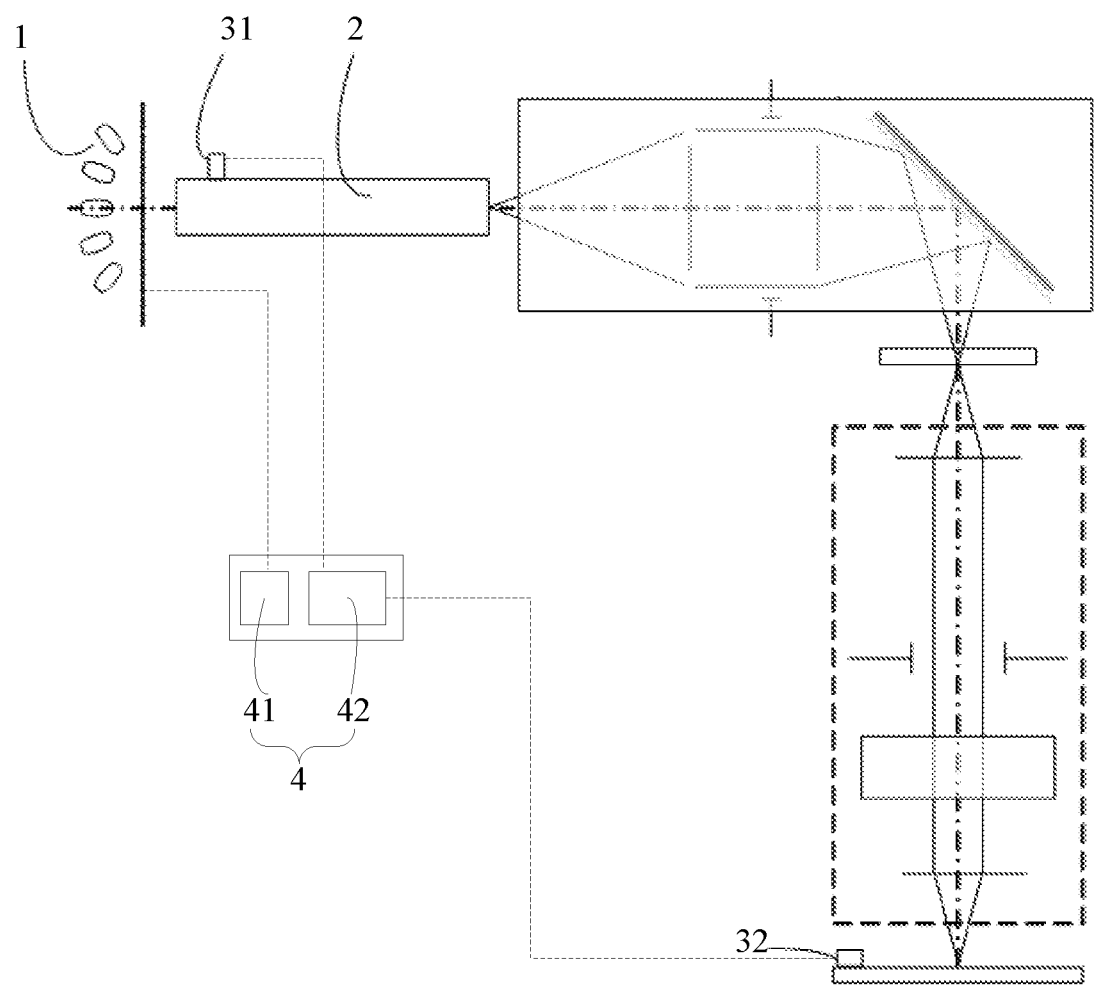
FIG. 3 is a structural schematic view of a system for controlling an exposure dose of a light source in accordance with the present invention.

As shown in FIG. 3, the present invention provides a system for controlling an exposure dose of a light source, including a light-emitting diode (LED) light source 1, a light homogenizer 2, an energy detection unit and an exposure dose control unit 4 coupled to both the LED light source 1 and the energy detection unit. The energy detection unit includes an energy detector 31 for the LED light source 1 or for the light homogenizer 2 and an energy spot sensor 32 for a wafer. The energy spot sensor 32 is a sensor for sensing the energy of a spot. The energy detector 31 is configured to detect an illuminance level of the LED light source 1, and the energy spot sensor 32 is configured to calibrate the energy detector 31 so as to establish a relationship therebetween. The exposure dose control unit 4 is configured to calculate a cumulative dose on the wafer, and the difference between this cumulative dose and a preset exposure dose may serve as a dose control basis for adjusting a light intensity of, or switching on/off, the LED light source 1. In this way, the wafer can be exposed with high dose control accuracy, without needing to use a variable attenuator or exposure shutter, thereby reducing the system's complexity and cost and enhance its reliability.

With continued reference to FIG. 3, the exposure dose control unit 4 may include an LED light source controller 41 and a dose control circuit board 42, which are coupled to each other. The LED light source controller 41 may be coupled to the LED light source 1, and the dose control circuit board 42 may be coupled to both the energy detector 31 and the energy spot sensor 32. The dose control circuit board 42 may be configured to sample actual illuminance on the wafer at a given frequency and calculate the cumulative dose by integrating the samples. Here, it is to be noted that light intensity measurements of the calibrated energy spot sensor 32 represent actual light intensities on the wafer. However, since the energy spot sensor 32 is mounted on a wafer stage and thus stays stationary relative to the wafer, it is actually not able to measure light intensities of each field of view on the wafer. Therefore, during dose control, it is necessary to convert illuminance measurements of the energy detector 31 to illuminance measurements of the energy spot sensor 32 as actual illuminance levels on the wafer based on the calibrating relationship between the energy spot sensor 32 and the energy detector 31.

Preferably, the dose control circuit board 42 may store thereon data about cumulative doses from shutdown to complete dark of the LED light source 1 at various light intensities. Since the LED light source 1 typically takes some time both to produce a stable light intensity after it is turned on and to be completely closed after it is shut down. During the course from shutdown to complete dark, the light intensity on the wafer will vary and an exposure dose will accumulate. Therefore, in one embodiment, cumulative doses from shutdown to complete dark of the LED light source 1 at various light intensities may be measured beforehand, and the measurements may be stored on the dose control circuit board 42 as a data list. During dose control, a cumulative dose corresponding to the used exposure intensity may be retrieved, and upon the current cumulative dose becoming equal to a preset dose minus the retrieved cumulative dose, the exposure dose control unit 4 takes an action to shut down the LED light source. The dose control circuit board 42 may also store thereon a relationship between a driving current of the LED light source 1 and a resulted light intensity. The dose control circuit board 42 may control the LED light source controller 41 based on a dose offset so that the latter adjusts the light intensity of the LED light source 1 based on the relationship between the driving current of the LED light source 1 and the resulted light intensity and that the wafer can be exposed with high dose control accuracy.

Preferably, the LED light source 1 may be an LED array and have a wavelength of 465 nm, or 435 nm, or 365 nm. The control system may include one or more such LED arrays.

Preferably, the light homogenizer 2 may be implemented as a light-homogenizing quartz rod.

The present invention also provides a method for use with the system as defined above. The method includes the steps detailed below.

In S1, the LED light source 1 and the energy detector 31 are turned on at the same time under the control of the exposure dose control unit 4, and the energy detector 31 starts to detect illuminance of the LED light source 1. Before detecting illuminance of the LED light source 1 by the energy detector 31, the energy spot sensor 32 may be calibrated (using any suitable conventional method, which will not be described here in further detail for the sake of brevity), and the calibrated energy spot sensor 32 may be then used in turn to calibrate the energy detector 31 so as to establish a relationship between the energy detector 31 and the calibrated energy spot sensor 32. Light intensity measurements of the calibrated energy spot sensor 32 represent actual light intensities on the wafer. However, since the energy spot sensor 32 is mounted on a wafer stage and thus stays stationary relative to the wafer, it is actually not able to measure light intensities of each field of view on the wafer. With the relationship established during the calibration between the energy spot sensor 32 and the energy detector 31, illuminance measurements of the energy detector 31, illuminance measurements of the energy detector 31 can be converted to illuminance measurements of the energy spot sensor 32 as actual illuminance levels on the wafer. In one embodiment, the energy detector 31 and the energy spot sensor 32 may be sensors of the same type and share the same set of optics, including the light homogenizer, the relay lens group, the relay reflector and the projection objective. Thus, both of them are associated with a constant transmittance, so:

$$I_{ESS} = \text{Gain} * I_{ED} + \text{Offset} = I_{wafer},$$

where, $I_{ED}$ represents an illuminance measurement of the energy detector 31; $I_{ESS}$, an illuminance measurement of the energy spot sensor 32; Gain, a scale factor; and Offset, a dose offset. According to this equation, the measurements of the energy detector 31 and the energy spot sensor 32 are obtained simultaneously, and Gain and Offset can be calculated based on them. $I_{wafer}$ denotes actually measured illuminance on the wafer.

In S2, the exposure dose control unit 4 samples actual illuminance on the wafer and calculates a cumulative dose $D_{get}$ by integrating the samples according to:

$$D_{get} = \int_0^t I_{wafer} \cdot t dt = \int_0^t (\text{Gain} * I_{ED} + \text{Offset}) \cdot t dt$$

where, $I_{wafer}$ denotes actually measured illuminance on the wafer and t represents time.

In S3, once the illuminance of the LED light source 1 becomes stable, a cumulative dose during the dark of the LED light source 1 is retrieved based on the current light intensity of the LED light source 1. Specifically, the dose control circuit board 42 may store thereon data about cumulative doses from shutdown to complete dark of the LED light source 1 at various light intensities. Since the LED light source 1 typically takes some time both to produce a stable light intensity after it is turned on and to be completely closed after it is shut down. During the course from shutdown to complete dark, the light intensity on the wafer will vary and an exposure dose will accumulate. Therefore, in one embodiment, cumulative doses from shutdown to complete dark of the LED light source 1 at various light intensities may be measured beforehand, and the measurements may be stored on the dose control circuit board 42 as a data list. During dose control, the cumulative dose during the dark of the LED light source 1 may be retrieved from the data list based on the stable illuminance level.

Figure 4:
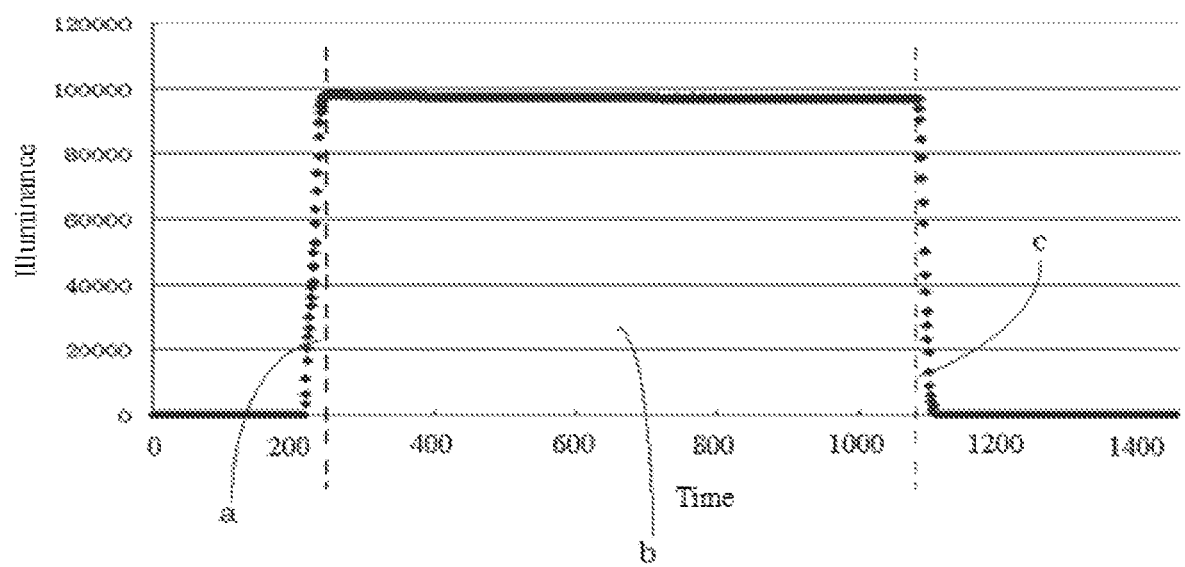
FIG. 4 shows a curve representing the evolution of illuminance of a LED light source from its activation to complete dark in accordance with the present invention.

In S4, upon the cumulative dose on the wafer calculated in S2 becoming equal to a preset dose minus the cumulative dose retrieved in S3, the exposure dose control unit 4 takes an action to shut down the LED light source 1. FIG. 4 shows a curve representing the evolution of illuminance of the LED light source 1 throughout a process consisting of the following phases: from activation to the time when the light intensity becomes stable (a); a duration in which the light intensity remains stable (b); and from shutdown to complete dark (c). As can be seen from the figure, in the phase from shutdown to complete dark of the LED light source, the light intensity on the wafer will varies and an exposure dose accumulates. If the LED light source 1 were shut down when the measured cumulative dose on the wafer is equal to the preset dose, the wafer would be definitely overexposed. In order to ensure accurate exposure, it is necessary to shut down the LED light source 1 upon the measured cumulative dose on the wafer becoming equal to the preset dose minus the cumulative dose retrieved in S3.

In S5, subsequent to the complete dark of the LED light source 1, the exposure dose control unit 4 takes an action to turn off the energy detector 31, the current cumulative dose on the wafer is compared with the preset dose $D_{set}$ given as:

$$D_{set} = \int_0^{t_{close}} (\text{Gain} * I_{ED} + \text{Offset}) \cdot t dt + D_{close}.$$

The cumulative dose $D_{get}$ upon the complete dark of the LED light source 1 can be expressed as:

$$D_{get} = \int_0^t I_{wafer} \cdot t dt = \int_0^{t_{close}} (\text{Gain} * I_{ED} + \text{Offset}) \cdot t dt + \int_{t_{close}}^t ((\text{Gain} * I_{ED} + \text{Offset}) \cdot t dt.$$

Thus, an offset between them is $D = |D_{set} - D_{get}|$, where, $t_{close}$ represents the time when the LED light source is shut down; $D_{close}$, the cumulative dose during the dark of the LED light source 1; $I_{wafer}$, actually measured illuminance on the wafer; and |•|, an absolute value operation.

In S6, the exposure dose control unit 4 adjusts the light intensity of the LED light source 1 based on the offset D. Specifically, the dose control circuit board 42 may store thereon a relationship between a driving current of the LED light source 1 and a resulted light intensity as a data list which can be automatically updated according to a predetermine time scheme. The dose control circuit board 42 may dictate, based on the dose offset D, the LED light source controller 41 to adjust the light intensity of the LED light source 1 according to the relationship between the driving current of the LED light source 1 and the resulted light intensity.

In summary, the present invention provides a system and method for controlling an exposure dose of a light source. The system includes an LED light source 1, a light homogenizer 2, an energy detection unit and an exposure dose control unit 4 coupled to both the LED light source 1 and the energy detection unit. The energy detection unit includes an energy detector 31 for the LED light source 1 or for the light homogenizer 2 and an energy spot sensor 32 for a wafer. By using the LED light source 1 capable of producing ultraviolet (UV) light in lieu of an existing mercury lamp, the system is less hazardous and safer by eliminating the risk of discharging hazardous mercury vapor into the environment when the mercury lamp is broken. Moreover, exposure illuminance of the LED light source 1 can be adjusted and the LED light source 1 itself can be turned on/off under the control of exposure dose control unit 4 to expose the wafer with high dose control accuracy, without needing to use a variable attenuator or an exposure shutter. This reduces the system's complexity and cost and increases its reliability.

Although a few embodiments of the present invention have been described herein, these embodiments are merely illustrative and are not intended to be construed as limiting the scope of the invention. Various omissions, substitutions and changes made without departing from the spirit of the invention are all intended to be included within the scope thereof.

What is claimed is:

1. A control method used with a system for controlling an exposure dose of a light source, the system comprising an LED light source, a light homogenizer, an energy detection unit and an exposure dose control unit coupled to both the LED light source and the energy detection unit, the energy detection unit comprising an energy detector corresponding to the LED light source or the light homogenizer and an energy spot sensor corresponding to a wafer, the control method comprising the steps of:
   S1) simultaneously turning on the LED light source and the energy detector under a control of the exposure dose control unit so that the energy detector detects illuminance of the LED light source;
   S2) sampling actual illuminance on the wafer and calculating a cumulative dose on the wafer by integrating the samples, by the exposure dose control unit;
   S3) once the illuminance of the LED light source becomes stable, retrieving a cumulative dose from shutdown to complete dark of the LED light source based on a light intensity of the LED light source; and
   S4) upon the cumulative dose on the wafer calculated in step S2 becoming equal to a preset dose minus the cumulative dose from shutdown to complete dark of the LED light source retrieved in step S3, shutting down the LED light source under the control of the exposure dose control unit.

2. The control method of claim 1, further comprising:
   S5) subsequent to the complete dark of the LED light source, turning off the energy detector under the control of the exposure dose control unit, and calculating a dose offset between the current cumulative dose on the wafer and the preset dose; and
   S6) adjusting the light intensity of the LED light source based on the dose offset under the control of the exposure dose control unit.

3. The control method of claim 1, wherein step S1 further comprises calibrating the energy spot sensor and calibrating the energy detector using the calibrated energy spot sensor.

4. The control method of claim 3, wherein in step S2, the exposure dose control unit samples an actual illuminance level expressed as:

$$I_{ESS} = \text{Gain} * I_{ED} + \text{Offset} = I_{wafer},$$

where, $I_{ED}$ represents an illuminance measurement of the energy detector; $I_{ESS}$ represents an illuminance measurement of the energy spot sensor; Gain and Offset respectively represent a scale factor and a dose offset; and $I_{wafer}$ represents actually measured illuminance on the wafer.

5. The control method of claim 4, wherein in step S2, the cumulative dose $D_{get}$ on the wafer is calculated according to:

$$D_{get} = \int_0^t I_{wafer} \cdot tdt = \int_0^t (\text{Gain} * I_{ED} + \text{Offset}) \cdot tdt$$

where, $I_{wafer}$ denotes actually measured illuminance on the wafer and t represents time.

6. The control method of claim 4, wherein in step S5, the preset dose $D_{set}$ is given as:

$$D_{set} = \int_0^{t_{close}} (\text{Gain} * I_{ED} + \text{Offset}) \cdot tdt + D_{close}$$

and the cumulative dose $D_{get}$ upon the complete dark of the LED light source is expressed as:

$$D_{get} = \int_0^t I_{wafer} \cdot tdt = \int_0^{t_{close}} (\text{Gain} * I_{ED} + \text{Offset}) \cdot tdt + \int_{t_{close}}^t (\text{Gain} * I_{ED} + \text{Offset}) \cdot tdt,$$

so the dose offset $D = |D_{set} - D_{get}|$, where, $t_{close}$ represents a timing when the LED light source is shut down; $D_{close}$ represents the cumulative dose retrieved in step S3; $I_{wafer}$ represents actually measured illuminance on the wafer; and $|\cdot|$ represents an absolute value operation.

7. The control method of claim 1, wherein in step S3, the cumulative dose from the shutdown to the complete dark of the LED light source corresponding to a light intensity thereof after the illuminance of the LED light source becomes stable is retrieved from the dose control circuit board.

8. The control method of claim 2, wherein in step S6, the dose control circuit board controls an LED light source controller based on the dose offset so that the LED light source controller controls the light intensity of the LED light source based on a relationship between a driving current of the LED light source and a resulted light intensity.

* * * * *